US007250929B2

(12) United States Patent
Ota

(10) Patent No.: US 7,250,929 B2
(45) Date of Patent: Jul. 31, 2007

(54) ACTIVE MATRIX DISPLAY DEVICE AND DIGITAL-TO-ANALOG CONVERTER

(75) Inventor: Masuyuki Ota, Matto (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 0 days.

(21) Appl. No.: 11/266,345

(22) Filed: Nov. 4, 2005

(65) Prior Publication Data

US 2006/0055640 A1 Mar. 16, 2006

Related U.S. Application Data

(63) Continuation of application No. PCT/JP04/006889, filed on May 14, 2004.

(30) Foreign Application Priority Data

May 16, 2003 (JP) ............... 2003-139445

(51) Int. Cl.
*G09G 3/30* (2006.01)
(52) U.S. Cl. ............... 345/76; 345/77; 315/169.3
(58) Field of Classification Search ............ 345/76–78, 345/82–84, 87, 88–90, 92–95, 98–100, 204–206, 345/208, 214; 315/169.3
See application file for complete search history.

(56) References Cited

U.S. PATENT DOCUMENTS 4,910,685 A * 3/1990 Imsand et al. ............... 345/22

| | | | | |
|---|---|---|---|---|
| 6,049,321 A * | 4/2000 | Sasaki | ............... | 345/99 |
| 6,351,077 B1 * | 2/2002 | Koyama | ............... | 315/169.3 |
| 6,590,554 B1 * | 7/2003 | Takayama | ............... | 345/92 |
| 6,617,799 B2 * | 9/2003 | Koyama | ............... | 315/169.3 |
| 6,940,496 B1 * | 9/2005 | Kim | ............... | 345/204 |

(Continued)

FOREIGN PATENT DOCUMENTS

JP 2002-351400 12/2002

(Continued)

OTHER PUBLICATIONS

The 22nd International Display Research Conference (Euro Display 2000), K. Abe, M. Shimoda, H. Haga, H. Asada, H. Hayama, K. Iguchi, D. Iga, Y. Iketsu, H. Imura and S. Miyano, "16-1: A Poly-Si TFT 6-bit Current Data Driver for Active Matrix Organic Light Emitting Diode Displays", pp. 279-282.

*Primary Examiner*—Richard Hjerpe
*Assistant Examiner*—Mansour M. Said
(74) *Attorney, Agent, or Firm*—Oblon, Spivak, McClelland, Maier & Neustadt, P.C.

(57) ABSTRACT

An active-type display device includes a plurality of video signal lines that are formed on a substrate, a plurality of pixels that are connected to the video signal lines and are operated by current signals, and a video signal driver that supplies video currents to the pixels via the video signal lines on the basis of data signals that are supplied from an external circuit. The video signal driver includes a plurality of DA units that sum up at least one of a plurality of gray-level reference currents, which are stored in constant current memory circuits, on the basis of the data signals, thereby executing conversion to the video current.

11 Claims, 14 Drawing Sheets

U.S. PATENT DOCUMENTS

| | | |
|---|---|---|
| 7,091,938 B2* | 8/2006 | Inukai et al. .................. 345/76 |
| 2003/0128199 A1* | 7/2003 | Kimura ...................... 345/204 |
| 2005/0057580 A1* | 3/2005 | Yamano et al. ............. 345/690 |

FOREIGN PATENT DOCUMENTS

| | | | |
|---|---|---|---|
| JP | WO 02/39420 A1 | 2/2003 |
| JP | 1288901 A2 | 3/2003 |
| KR | 2001-50632 | 6/2001 |
| KR | 2001-62310 | 7/2001 |

\* cited by examiner

ACTIVE MATRIX DISPLAY DEVICE AND DIGITAL-TO-ANALOG CONVERTER

CROSS-REFERENCE TO RELATED APPLICATIONS

This is a Continuation Application of PCT Application No. PCT/JP2004/006889, filed May 14, 2004, which was published under PCT Article 21(2) in Japanese.

This application is based upon and claims the benefit of priority from prior Japanese Patent Application No. 2003-139445, filed May 16, 2003, the entire contents of which are incorporated herein by reference.

BACKGROUND OF THE INVENTION

1. Field of the Invention

The present invention relates to an active matrix display device, and more particularly to an active-type display device that executes signal write using a current signal.

2. Description of the Related Art

Thee has been an increasing demand for a flat-panel display device that is typified by a liquid crystal display device, which has advantageous features of small thickness, light weight and low power consumption, compared to a CRT display. In particular, an active matrix display device, in which each pixel is provided with a switch that has a function of electrically separating an on-pixel and an off-pixel and holding a video signal to the on-pixel, is capable of achieving a good display quality without crosstalk between adjacent pixels. Thus, the active matrix display device has recently been applied to various displays including displays of mobile information devices.

In the field of liquid crystal displays, there is known a technique wherein a driver circuit that outputs video signals to pixels is formed of semiconductor devices using polysilicon and is integrally built on the same substrate as pixels. Thereby, the number of contacts between the panel and external circuits can be reduced, and the mechanical strength of the display device can be increased.

In recent years, organic electroluminescent (EL) display devices have widely been developed as self-luminous displays that can achieve higher responsivity and a wider viewing angle than liquid crystal displays. For instance, a technique of integrally forming a driver circuit on the same substrate as pixels in the field of organic EL displays is discussed in Reiji Hattori, et al. (three), "Circuit Simulation of Polysilicon TFT Based Current-Writing Active-Matrix Organic LED Display", IEICE Technical Report, the Institute of Electronics, Information and Communication Engineers (IEICE), 2001, Vol. 101, No. 15, pp. 7–14.

In the case of integrally forming a driver circuit on the same substrate as pixels, however, a display defect tends to occur due to non-uniform characteristics of semiconductor devices that are formed of polysilicon.

BRIEF SUMMARY OF THE INVENTION

The present invention has been made in consideration of the above problem, and its object is to provide an active matrix display device that has a good display quality even in the case where a driver circuit is integrally formed on a substrate on which pixels are formed.

According to an aspect of the invention, there is provided an active matrix display device comprising:

a plurality of video signal lines formed on a substrate; a plurality of pixels which are connected to the video signal lines and are operated by current signals; and a video current supply section which converts a digital data signal, that is supplied from an external circuit, to a corresponding analog current signal, and outputs the analog current signal to the associated video signal line, the video current supply section including a plurality of DA units which are disposed in association with the respective video signal lines, and sums up at least one of a plurality of gray-level reference currents on the basis of the digital data signal, thereby executing conversion to the analog current signal; a refresh pulse generating circuit which successively outputs refresh timing pulses for controlling a timing for periodically storing the gray-level reference currents in said plurality of DA units; and output current hold circuits which are disposed in association with the respective video signal lines, successively store the analog current signals, and output the analog current signals as a batch to said plurality of video signal lines, and the output current hold circuit including a transistor which stores the analog current signal at a selection time and outputs the stored analog current signal at a non-selection time.

The invention can realize an active matrix display device that has a good display quality even in the case where a driver circuit is integrally formed on a substrate on which pixels are formed.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Referring now to the accompanying drawings, a detailed description is given of a first embodiment of the invention in which an active matrix display device of the invention is applied to an organic EL display device.

Figure 1:
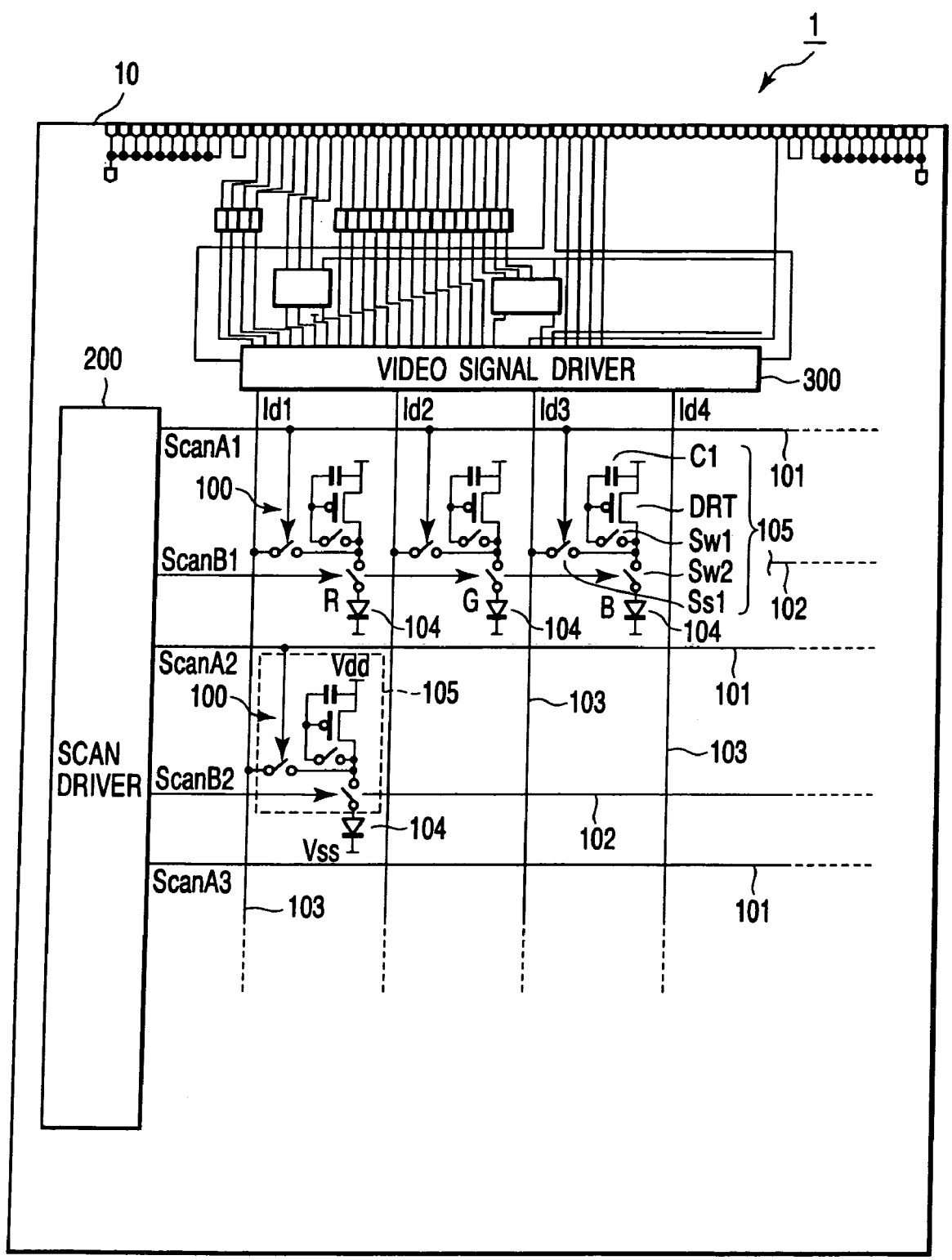
FIG. 1 is a plan view showing an organic EL display device according to a first embodiment of the present invention.

As is shown in FIG. 1, an organic EL display device 1 is an active matrix display device that effects color display. The organic EL display device 1 comprises a plurality of pixels 100 that are arranged in a matrix (M×N) on an insulating support substrate 10 formed of, e.g. glass; a plurality of scan lines 101 and control lines 102 that are disposed in a row direction of the pixels 100; a plurality of video signal lines 103 that are disposed in a column direction of the pixels 100; a scan driver 200 that outputs scan signals ScanAm (m=1, 2, ..., M) to the scan lines 101 and control signals ScanBm to the control lines 102; and a video signal driver 300 that supplies video currents Idn (n=1, 2, ..., N) as video signals to the video signal lines 103.

Each pixel 100 includes a display element 104 including an optical active layer between opposed electrodes; and a pixel circuit 105 that supplies the display element 104 with a drive current based on the video current Idn, thereby to drive the display element 104. The display element 104 is, for instance, a self-luminous device. In this embodiment, the display element 104 is an organic EL element including at least an organic light-emitting layer as an optical active layer. Three kinds of organic EL elements, which emit red, blue and green light, are arranged in a predetermined order. The method of realizing color display is not limited to this scheme. For example, a method of combining an organic EL element that emits white light and a color filter, or a method of executing wavelength conversion for an organic EL device that emits blue light may be adopted.

The pixel circuit 105 stores the video current Idn at a selection time of the pixel 100, and outputs the stored video current Idn as a drive current to the display element 104 at a non-selection time of the pixel 100. The pixel circuit 105 comprises a drive transistor DRT that is connected with the display element 104 in series between a first voltage supply Vdd and a second voltage supply Vss and is formed of, e.g. a p-type thin-film transistor; a capacitor C1 that is connected between a first terminal (source) and a control terminal (gate) of the drive transistor DRT; a first switch SW1 that is connected between a second terminal (drain) and the control terminal of the drive transistor DRT and is formed of a p-type thin-film transistor; a second switch SW2 that is connected between the second terminal of the drive transistor DRT and a first electrode (an anode in this case) of the display element and is formed of a p-type thin-film transistor; and a pixel switch SS1 that is connected between the second terminal of the drive transistor DRT and a video signal supply terminal and is formed of a p-type thin-film transistor.

The gate of the pixel switch SS1 of each pixel 100 is connected to the associated one of the scan lines 101 that are provided for the respective rows of the pixels 100. The pixel switch SS1 is on/off controlled by the scan signal ScanAm that is supplied from the scan driver 200, which is integrally formed on the support substrate 10. The control line that controls the first switch SS1 and the scan line 101 may independently be provided, or may be formed as the same line by making the conductivity type of the pixel switch SS1 identical to the conductivity type of the first switch SW1. In this case, an increase in the number of lines can be suppressed. The control terminal (gate) of the second switch SW2 is connected to the scan driver 200 via the control line 102. The second switch SW2 is on/off controlled by the control signal ScanBm that is supplied from the scan driver.

In this embodiment, the thin-film transistors that form the pixel circuit 105 are top-gate thin-film transistors each including a semiconductor layer of polysilicon. All the thin-film transistors are formed in the same fabrication steps with the same layer structures.

The video signal supply terminal that is connected to the second terminal of the drive transistor DRT via the pixel switch SS1 is connected to the video signal line 103 that is commonly connected to each column of pixels 100. The video signal supply terminal is connected to the video signal driver 300, which is the drive circuit, via the video signal line 103.

The scan driver 200 includes a shift register and an output buffer. The scan driver 200 successively transfers a horizontal scan start pulse, which is supplied from outside, to the next stage, and supplies an output of each stage as the scan signal ScanAm to the scan line 101 via the output buffer. This timing is synchronized with one horizontal scan cycle. The scan driver 200 subjects the output of each stage to a signal process, thereby producing the control signal ScanBm and supplying it to the control line 102. A circuit, which generates scan waveforms (control signals) with different pulse widths and phases from one output of the shift register, is formed using low-temperature polysilicon. For example, an output of the shift register is delivered to one of inputs of each of NOR circuits, the number of which corresponds to the number of outputs, and the other input of each NOR circuit is controlled by the control line. Thus, scan waveforms with different pulse widths and phases can be output. The scan driver 200 and the video signal driver 300 are integrally formed on the support substrate 10.

Figure 2:
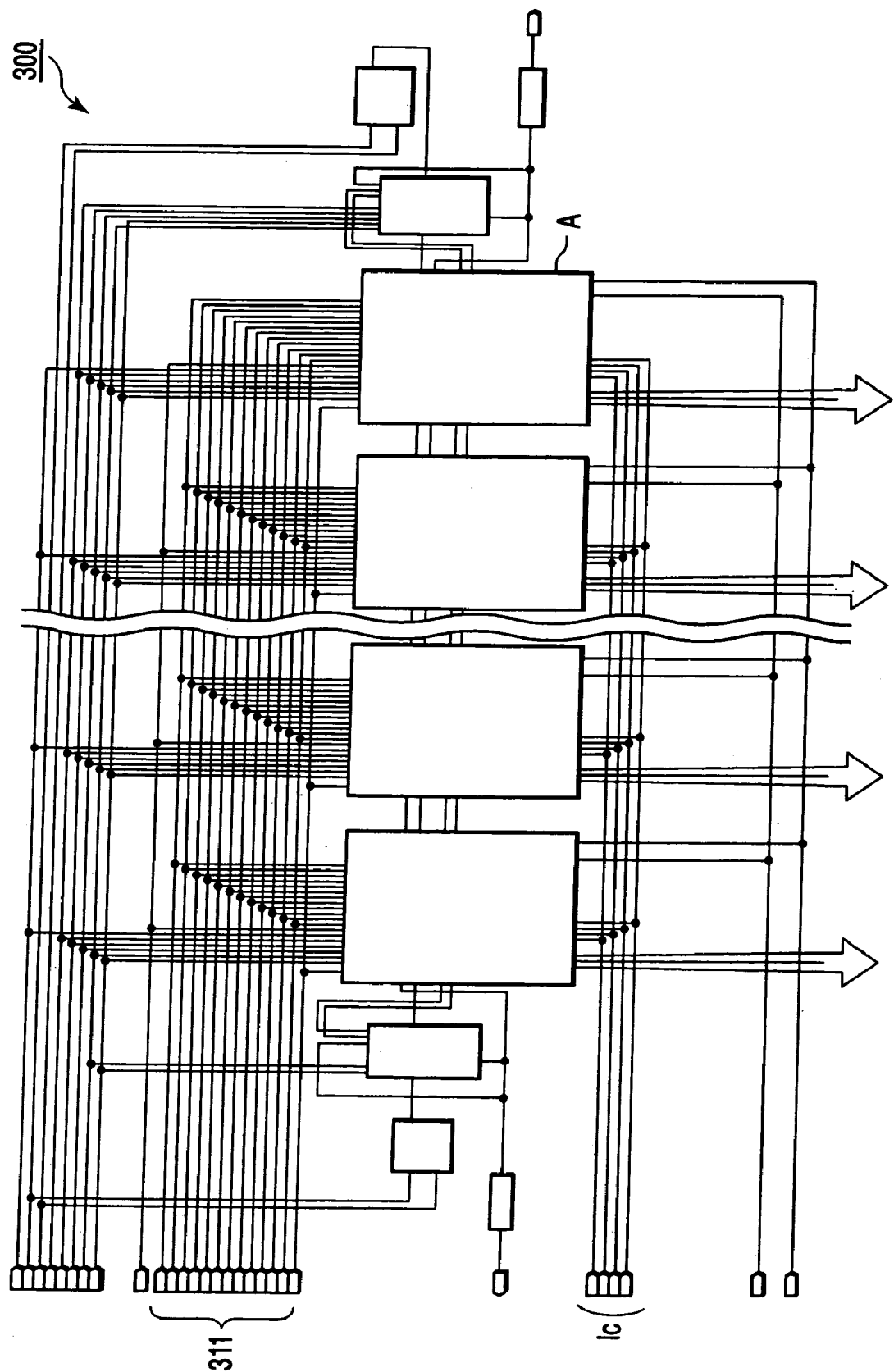
FIG. 2 shows the entirety of a video signal driver of the organic EL display device.
Figure 3:
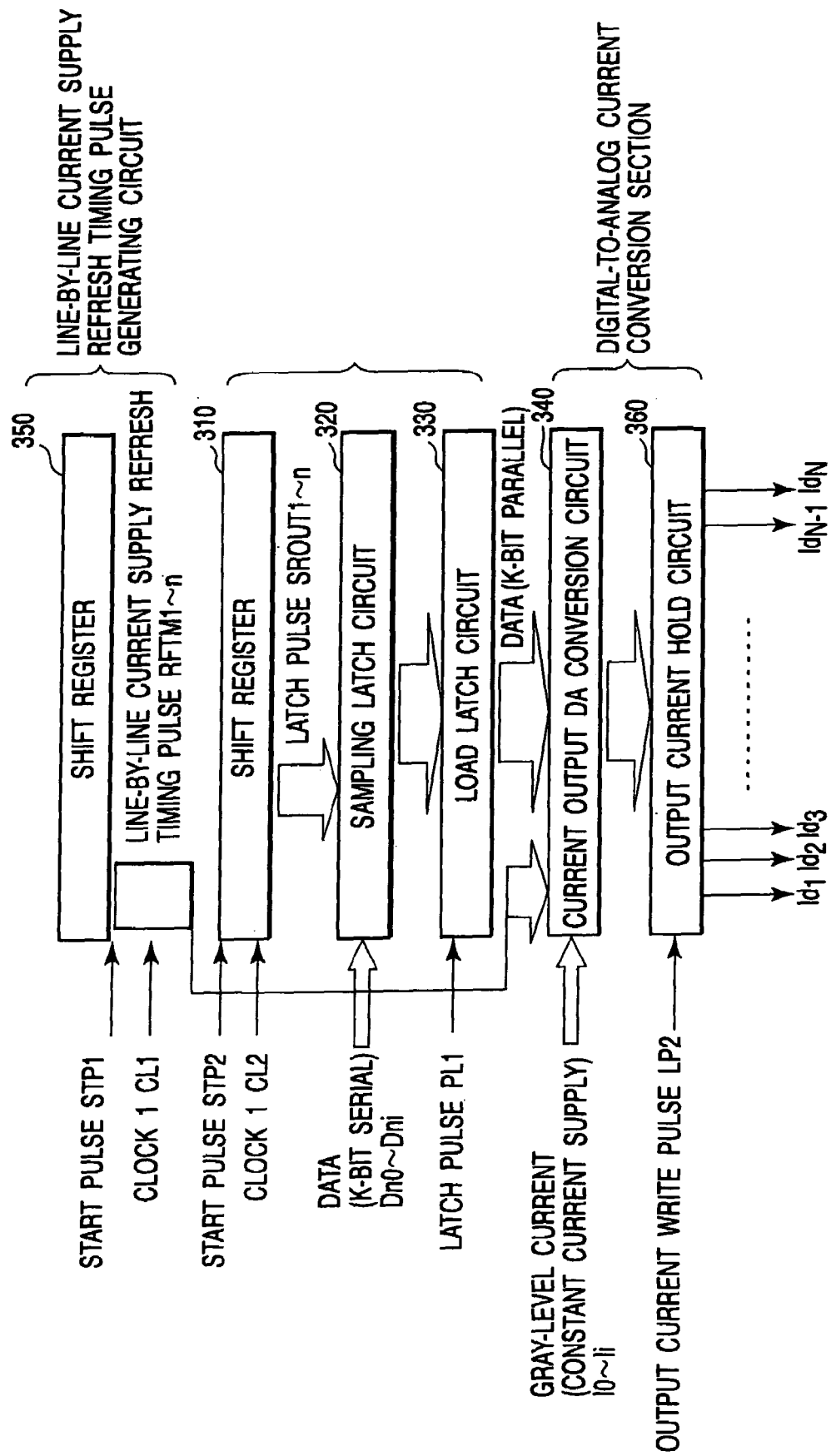
FIG. 3 is a block diagram of the video signal driver.
Figure 4:
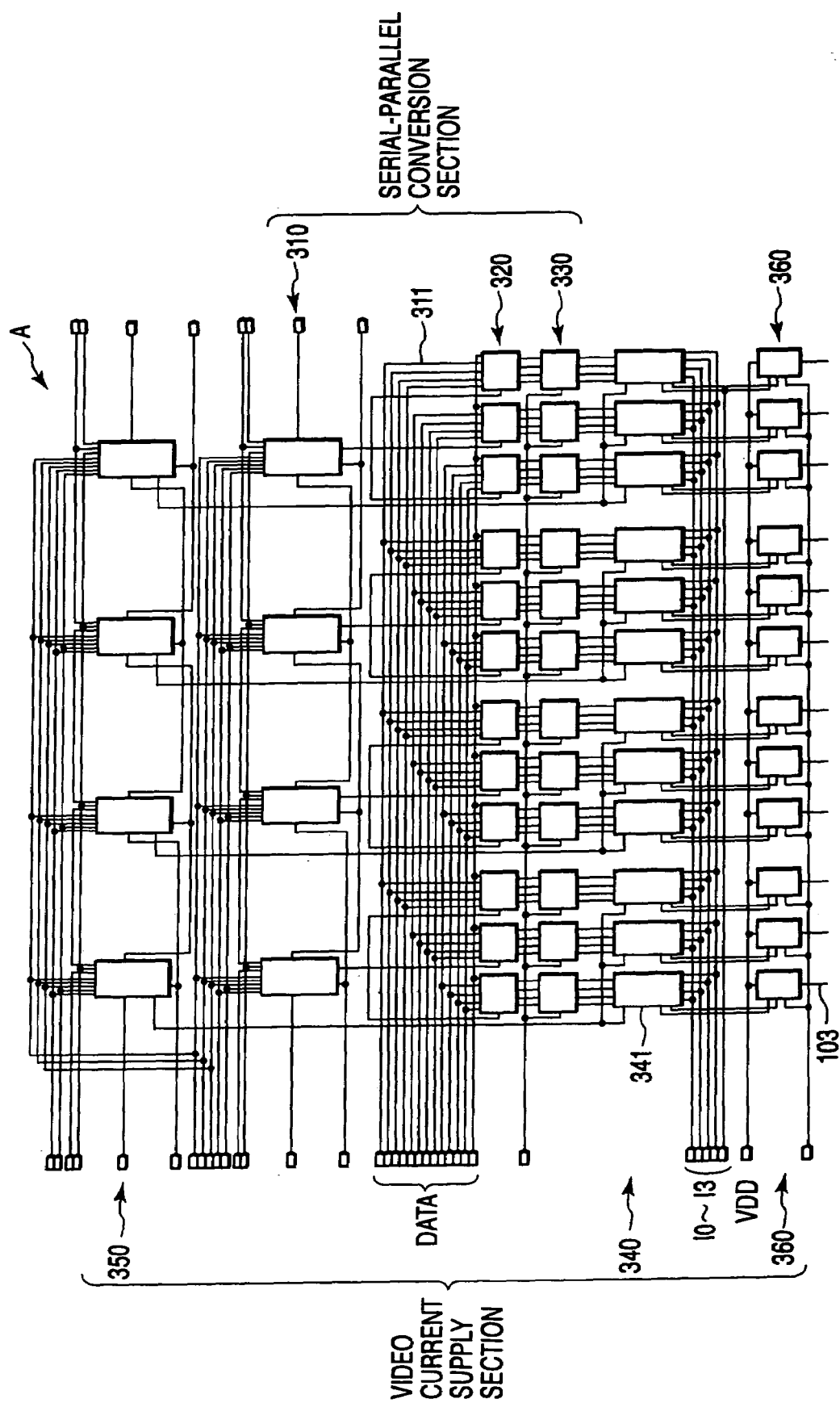
FIG. 4 shows a part A in FIG. 2 in an enlarged scale.

As is shown in FIG. 2 to FIG. 4, the video signal driver 300 comprises a serial-parallel conversion section and a video current supply section. The serial-parallel conversion section converts serial data to parallel data in order to output video signals, which are input as serial data signals from outside, to each pixel group (each row of pixels 100 in this case) at a time, which is connected to the associated scan line 101. The video current supply section converts the obtained parallel data Dn0 to Dni to analog currents corresponding to values of the data, and outputs the analog currents to the associated video signal lines 103.

The serial-parallel conversion section comprises video lines 311, through which digital data signals DATA are input as video signals from an external circuit; a sampling latch circuit 320 that serial/parallel converts the data signals DATA from the video lines 311 and successively outputs and stores the parallel data signals into memory elements that are arranged in association with respective video signal lines 103; a shift register 310 that controls the operation timing of the sampling latch circuit 320; and a load latch circuit 330 that outputs, as a batch, the data signals Dn0 to Dni for one row, which are held in the sampling latch circuit 320, into memory elements that are arranged in association with the respective video signal lines 103, and latches the data signals for one horizontal scan time period.

Specifically, the serial-parallel conversion section is a circuit including the two-stage latch structures 320 and 330.

At rising edges of latch pulses SROUT1 to SROUTn that are generated by the shift register 310, serial data DATA of k bits (4 bits for each of RGB in this case) are successively stored in the sampling latch circuit 320 associated with each video signal line 103. During a data blanking period in one horizontal scan cycle, the data for the pixels 100 corresponding to the associated scan line 101 are stored as a batch in the load latch circuit 330 at the timing of a latch pulse LP1, and are held for one horizontal scan period.

With the input of a start pulse STP2, the shift register 310 successively outputs, in one horizontal scan period, latch pulses SROUT1 to SROUTn with pulse phases shifted at every clock CL2 and displaced by one clock between the video signal lines 103.

The sampling latch circuit 320 is configured such that half-latch circuits, the number of which is equal to the number of bits, are arranged in parallel. Each half-latch circuit stores serial data at the timing of the output from the shift register 310. The load latch circuit 330 is configured such that half-latch circuits, the number of which is equal to the number of bits, are arranged in parallel, and stores digital data, Dn0 to Dni, at the timing of the latch pulse LP1.

The video current supply section comprises a DA conversion circuit 340 including a plurality of DA units 341, which are disposed in association with the video signal lines 103, convert data signals Dn0 to Dni from the load latch circuit 330 to analog signals, and output the analog signals to the video signal lines 103 as video currents Idn; a refresh pulse generating circuit 350 that outputs a refresh timing pulse RFTM, which controls the timing for periodically storing a constant current Ic in a constant current memory circuit 342 in each DA unit 341; and an output current hold circuit 360 that holds video currents Idn, which are supplied from the DA conversion circuit 340, for one horizontal scan period, and outputs the video currents Idn to the video signal lines 103 as a batch in association with each pixel group.

Figure 5:
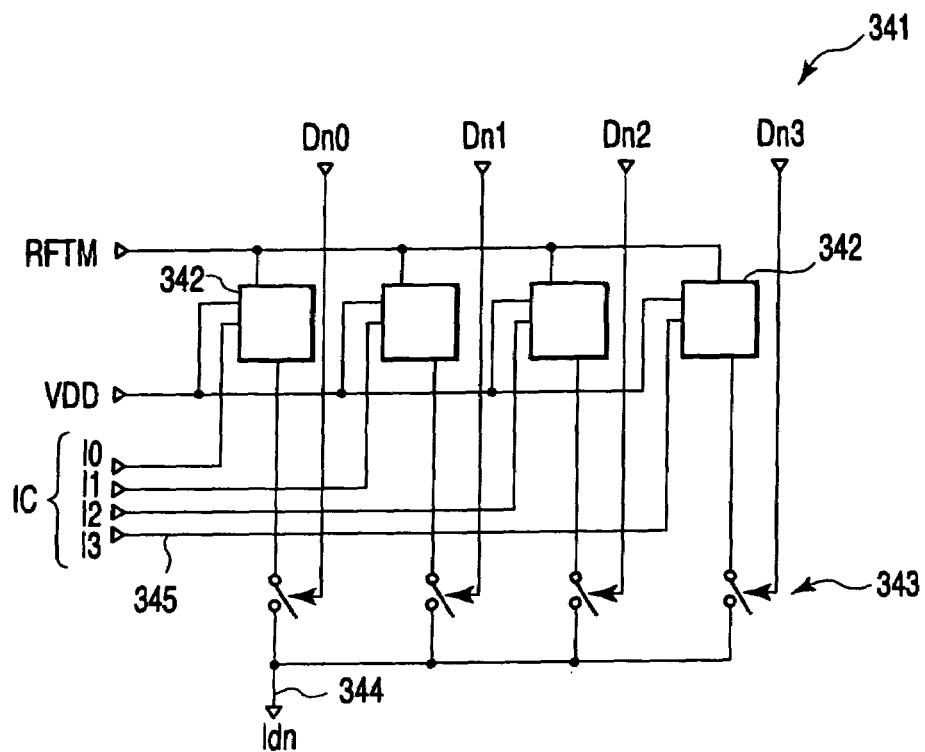
FIG. 5 schematically shows a DA unit of the organic EL display device.
Figure 6:
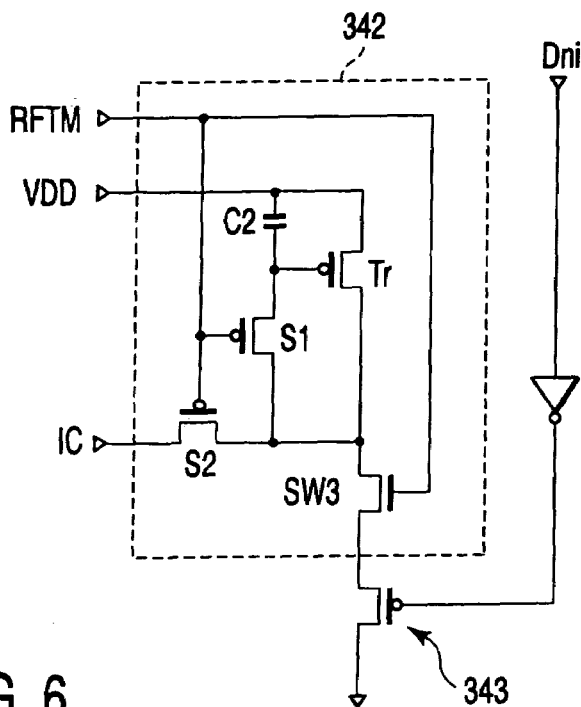
FIG. 6 shows a specific example of the DA unit.

FIG. 5 shows the DA unit 341 that corresponds to one output of the DA conversion circuit 340. FIG. 6 shows the structure of a 1-bit component of the DA unit 341. Each DA unit 341 has a four-bit construction in association of each of RGB. The DA units 341 associated with three video signal lines 103 of the respective colors are driven at the same time.

The DA unit 341 is provided in association with the video signal line 103. In sync with the refresh timing pulse RFTM from the refresh pulse generating circuit 350, the DA unit 341 converts data signals Dn0 to Dni to an analog current signal.

Each DA unit 341 comprises constant current memory circuits 342, the number of which corresponds to the number of bits of the data signals DATA; switch circuits 343 that control output/non-output of the associated constant current memory circuits 342 in accordance with the data signals DATA; a video current output line 344 that connects the respective output terminals of the switch circuits 343; and constant current supply lines 345 that supply different constant currents Ic to the respective constant current memory circuits 342.

The constant current memory circuit 342 is a circuit that stores a gray-level reference current Ic (I0–I3), which is input at a selection time, and outputs the stored gray-level reference current Ic (I0–I3) at a non-selection time. In this embodiment, the constant current memory circuit 342 is formed of a current copy circuit. Specifically, the constant current memory circuit 342 comprises a transistor Tr; a switch S1 that is connected between the gate and drain of the transistor Tr; a switch S2 that is connected between the drain of the transistor Tr and the constant current supply line; a switch S3 that is connected between the drain of the transistor Tr and an output terminal of the current copy circuit; and a capacitor C2 having both terminals connected to the gate and source of the transistor.

In the state in which the switches S1 and S2 are closed and the switch S3 is opened, the constant current memory circuit 342 constitutes a self-bias circuit between the gate and drain of the transistor Tr. The constant current memory circuit 342 operates such that a current flowing through the source-drain path of the transistor Tr via the switch S1 may become a desired gray-level reference current Ii. Subsequently, in the state in which the switches S1 and S2 are opened and the switch S3 is closed, the capacitor C2 stores a gate-source voltage at a time when the amount of the current, which flows through the source-drain path of the transistor Tr, becomes equal to that of the gray-level reference current. The gray-level reference current Ii is output via the switch S3. The switches S1 to S3 are controlled by a common control signal, i.e. the refresh timing pulse RFTM from the shift register SR. The switch S1 and switch S2 are formed of thin-film transistors of the same polarity, and the switch S3 is formed of a thin-film transistor of a polarity that is different from the polarity of the switches S1 and S2. In this embodiment, the transistor Tr, switch S1 and switch S2 are p-type thin-film transistors, and the switch S3 is an n-type thin-film transistor.

The output/non-output from the constant current memory circuit 342 is controlled by the switch circuit 343 in accordance with the data signal DATA. The sum of output currents from the respective switch circuits 343 flows in the video current output line 344 as a video current.

As described above, the circuit, which stores the gray-level reference currents Ic corresponding to the respective bits in the state in which the refresh timing pulse RFTM is set in the active state, and retains the gray-level reference currents Ic in the inactive state, is provided for each of the video signal lines 103. Therefore, the constant current supply that generates gray-level reference currents Ic for the respective video signal lines 103 can be provided.

Figure 7:
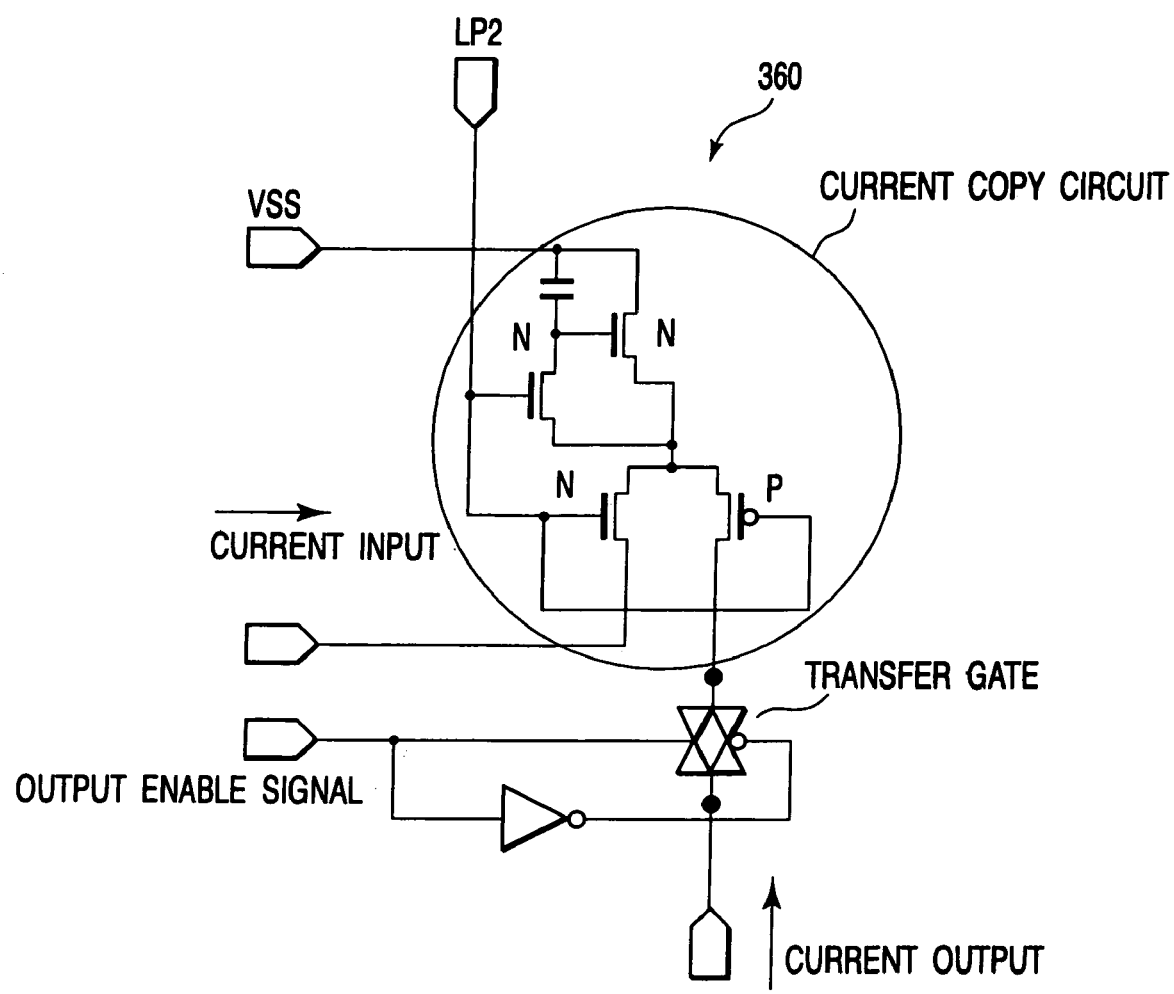
FIG. 7 is a circuit diagram that shows a part of an output current hold circuit of the organic EL display device.

As is shown in FIG. 7, the output current hold circuit 360 uses a current copy circuit. The output current hold circuit 360 stores the video current value at the timing of an output current write pulse LP2 and holds it during one horizontal scan period. At this time, the direction of input current in this current copy circuit is reverse to the direction in the current copy circuit of the constant current memory circuit 342 of the DA unit 341. Thus, the conductivity type of each transistor in the output current hold circuit 360 is reverse to that of each transistor in the constant current memory circuit 342.

The current copy circuit is also used in the output current hold circuit 360, as described above. Hence, even if the characteristics of the transistor devices provided in association with the video signal lines 103 are non-uniform, the video current value of the basic input section can be copied by the self-bias function of the current copy circuit. Thereby, a stable video current supply section can be realized.

This structure is particularly effective in the circuit using low-temperature polysilicon with great non-uniformity in characteristics. Even in the case where the driver circuit is integrally built on the support substrate, the organic EL display device 1 with high display quality can be achieved.

With the above structure, in the state in which non-uniformity in threshold of transistors was ±1 V, non-uniformity in display luminance of 2% or less was successfully obtained among the pixels 100. The organic EL display device with high display quality and suppressed occurrence of stripes or non-uniformity was realized. If the scan driver 200 is also integrally built on the substrate, a very small, light organic EL display device 1 can be obtained.

Furthermore, in the present embodiment, a charging circuit for cutting off a current corresponding to the video signal and keeping the video signal line 103 at a constant potential in a certain part of the vertical scan period is integrally formed using polysilicon on the support substrate. This improves a black level increase, which poses a problem in the current-writing type pixel circuit 105, and a display defect due to a previously written video signal, and enhances the contrast ratio.

The present embodiment is directed to the case where low-temperature polysilicon thin-film transistors are used. The present invention is not limited to this embodiment. The invention is also effective in a case of using transistor devices with great non-uniformity in characteristics, bulk CMOSs, or high-temperature polysilicon transistors formed on a continuous grain silicon (CGS) quartz substrate.

As has been described above, with the built-in structure of the driver circuit, in particular, the video signal driver, the number of connection points with the external circuit can be reduced, the mechanical reliability can be enhanced, the peripheral picture-frame region can be reduced in size, and the weight of the entire panel can be reduced. In addition, using the video signal driver including the current copy circuit that is disposed in association with the video signal line, the length of the line of the current supply can be reduced, and the capacitive load of the current supply can be suppressed. A signal current can stably be supplied to the pixel. In addition, a high image quality display device, which has a large margin for characteristic non-uniformity of transistor devices and is free from stripes or roughness, can be realized.

Figure 8:
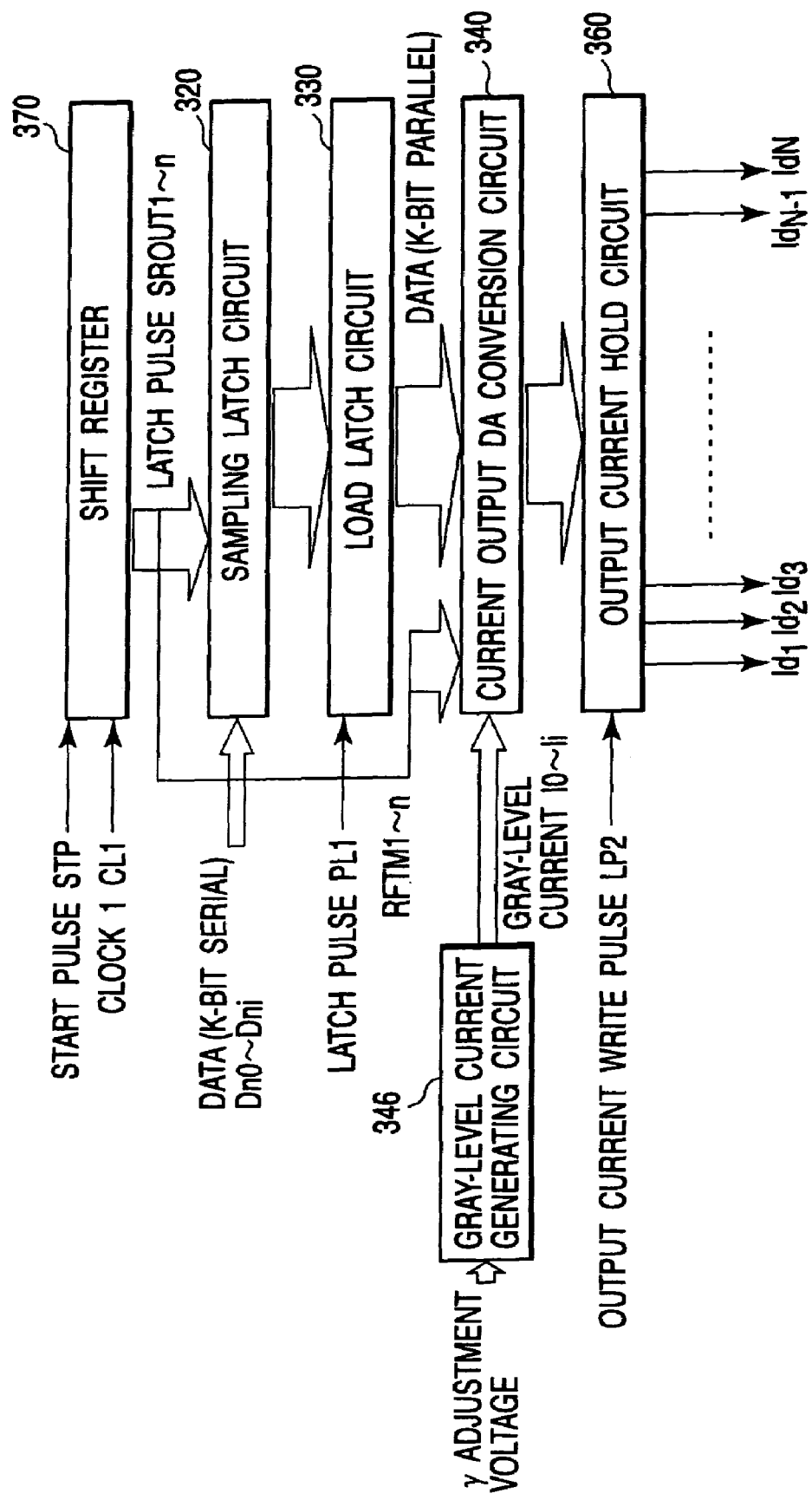
FIG. 8 shows a video signal driver of the organic EL display device.

The above-described embodiment is directed to the case of using the shift register 350 of the video current supply section and the shift register 310 of the serial-parallel conversion section. Alternatively, a circuit configuration as shown in FIG. 8, wherein a single shift register 370 is commonly used, may be adopted. The shift register 370 can output both the latch pulse SROUT and the refresh timing pulse RFTM.

Figure 9:
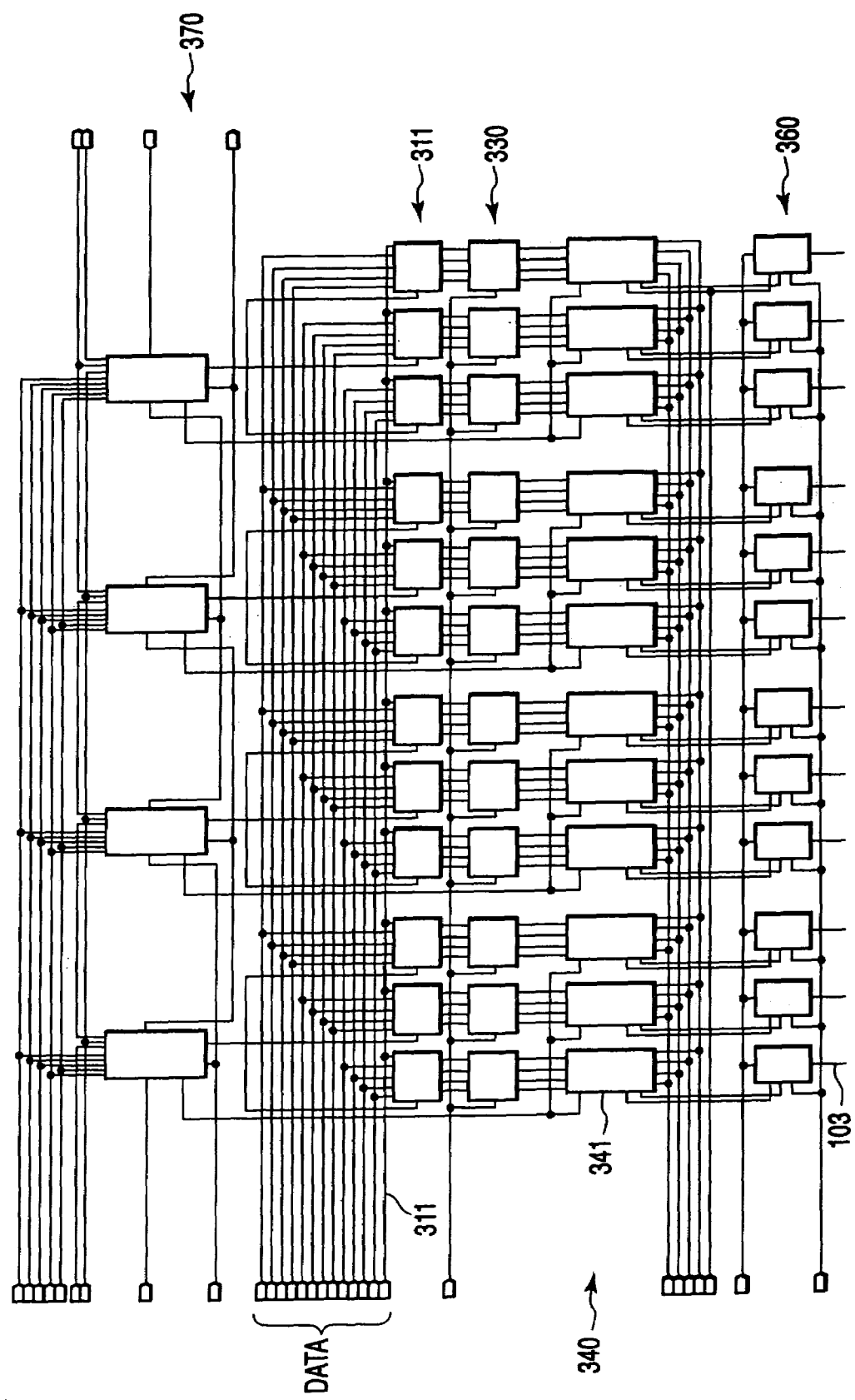
FIG. 9 is a circuit diagram that shows a part of a video signal driver according to a modification of the present invention.
Figure 10:
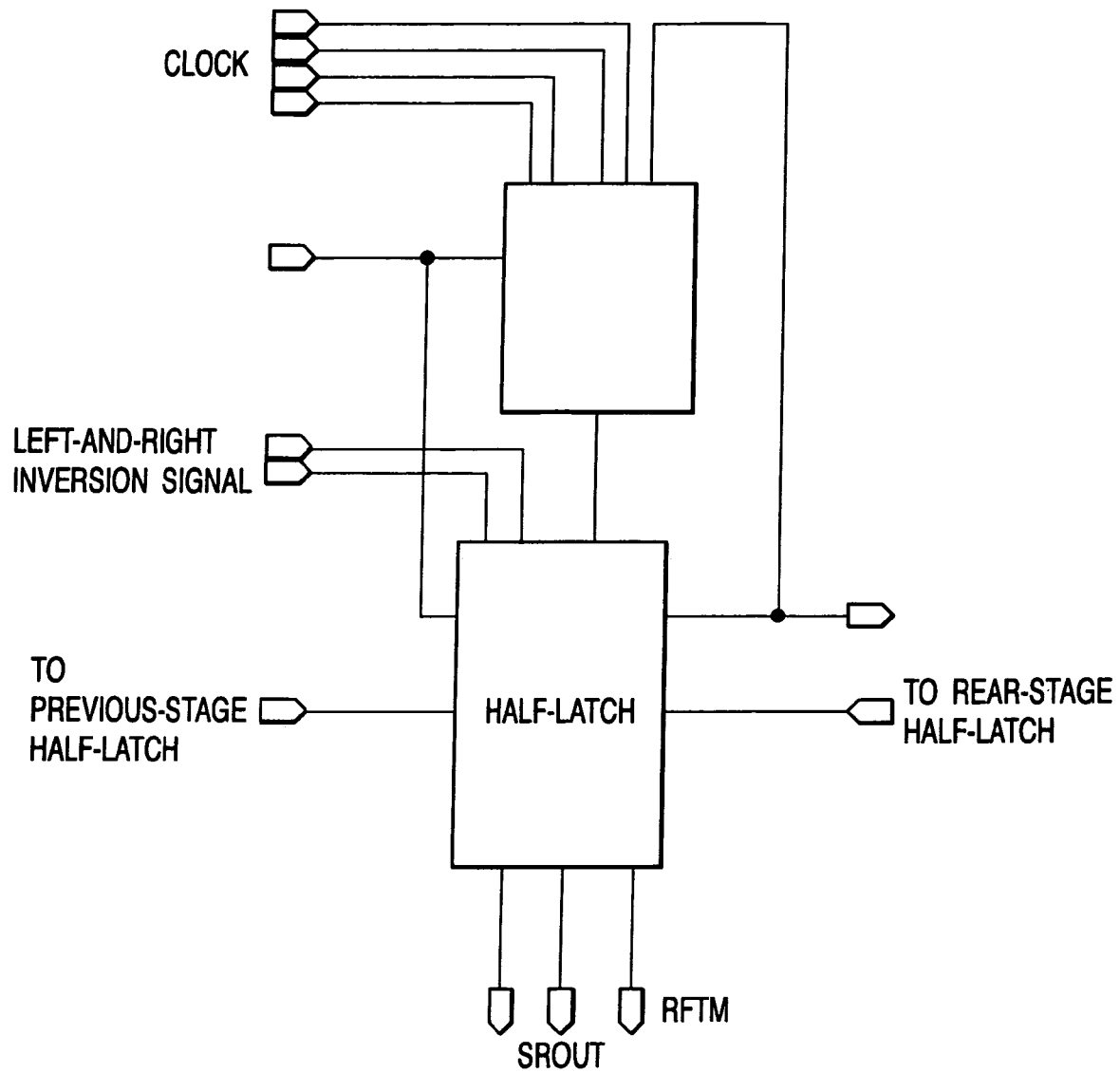
FIG. 10 is a block diagram that shows a part of a shift register according to a modification of the present invention.
Figure 11:
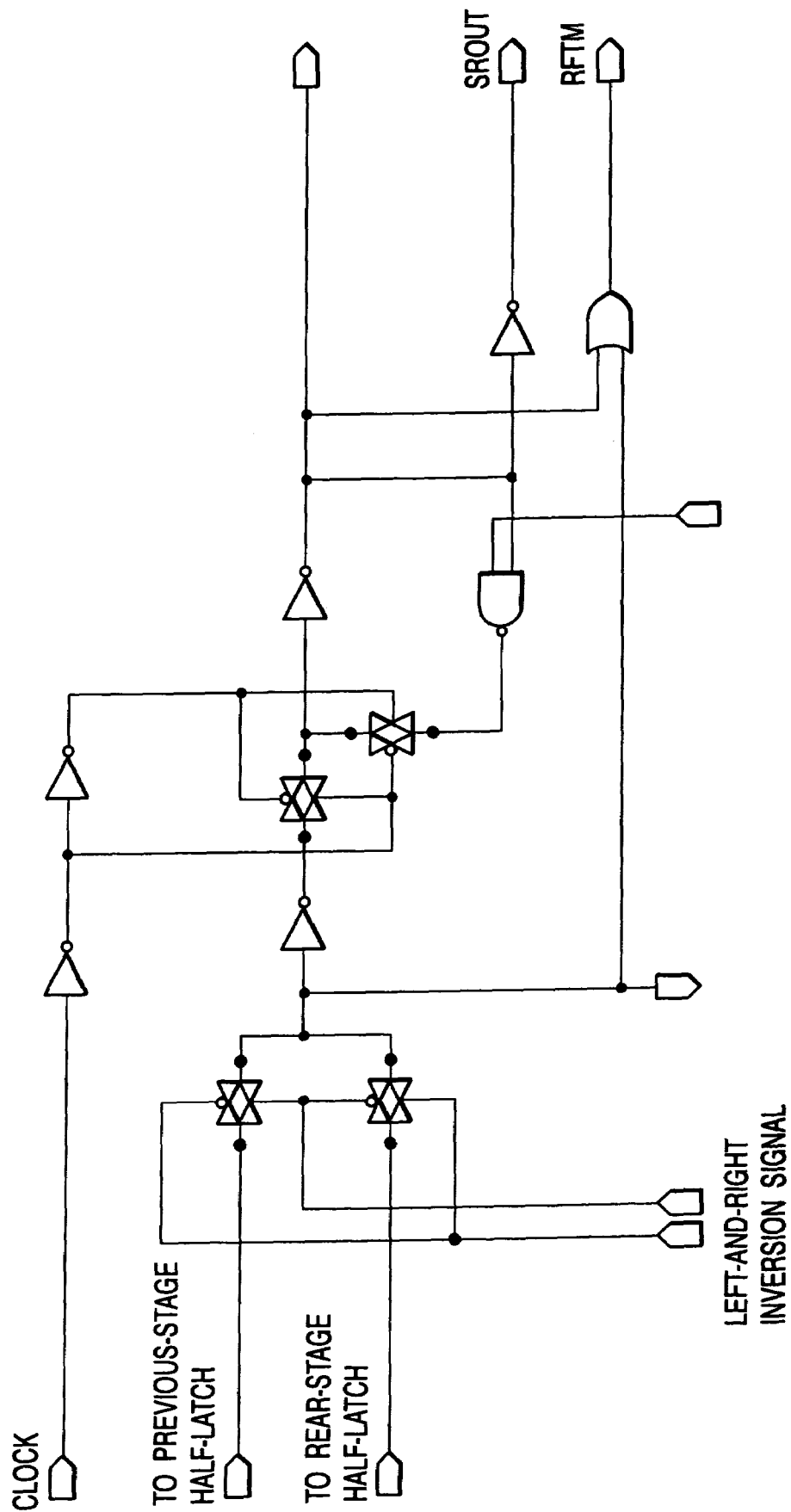
FIG. 11 is a block diagram that shows a part of a shift register according to another modification of the present invention.

For example, FIG. 9 shows a part of the circuit of the video signal driver, FIG. 10 shows the structure of one stage of the shift register 370, and FIG. 11 shows a specific structure. In the case of LOW active output type, this circuit produces a logical OR value of outputs of its own next stage and the previous stage (or the rear stage in the case of left-and-right inversion) of the shift register that comprises half-latch circuits. The circuit outputs a LOW active shift pulse SROUT for each line (a logical AND value is produced in the case of HIGH active output type). Thereby, the circuit scale can greatly be reduced, and a still smaller, lighter display device can be obtained.

A circuit 346 that generates gray-level reference currents, as shown in FIG. 8, may integrally be formed on the support substrate 10. In this case, voltage-to-current conversion is effected by a single transistor. Even if there is non-uniformity in characteristics of voltage/current conversion transistors that determine gray-level reference currents, output currents can be equalized by adjusting the gate voltages from outside. The adjusted voltage can also be used as a γ adjustment voltage for adjusting a γ characteristic. Thus, it should suffice if voltage supply is executed from outside, and the compatibility with the external circuit of the display device is enhanced.

Figure 12:
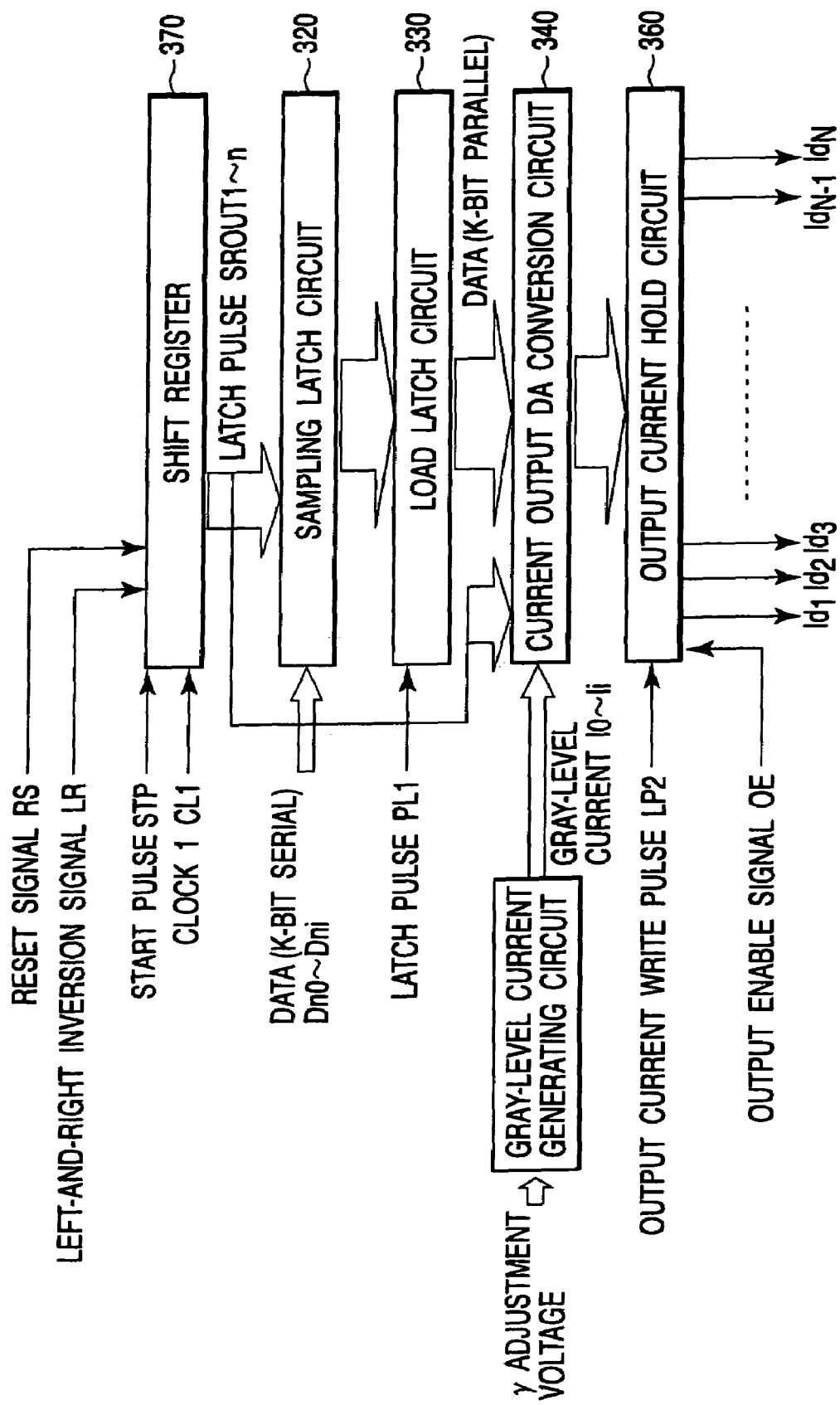
FIG. 12 is a block diagram that shows a video signal driver according to a modification of the present invention.

The above-described embodiment is directed to the case of line-sequential driving in which batch-write is executed for the pixels 100 connected to one scan line 101. Alternatively, the invention is applicable to dot-sequential driving. In this case, the output current hold circuit 360 can be omitted. In addition, as shown in FIG. 12, the functions of a reset signal, a left-and-right inversion signal and an output enable signal may be added.

Figure 13:
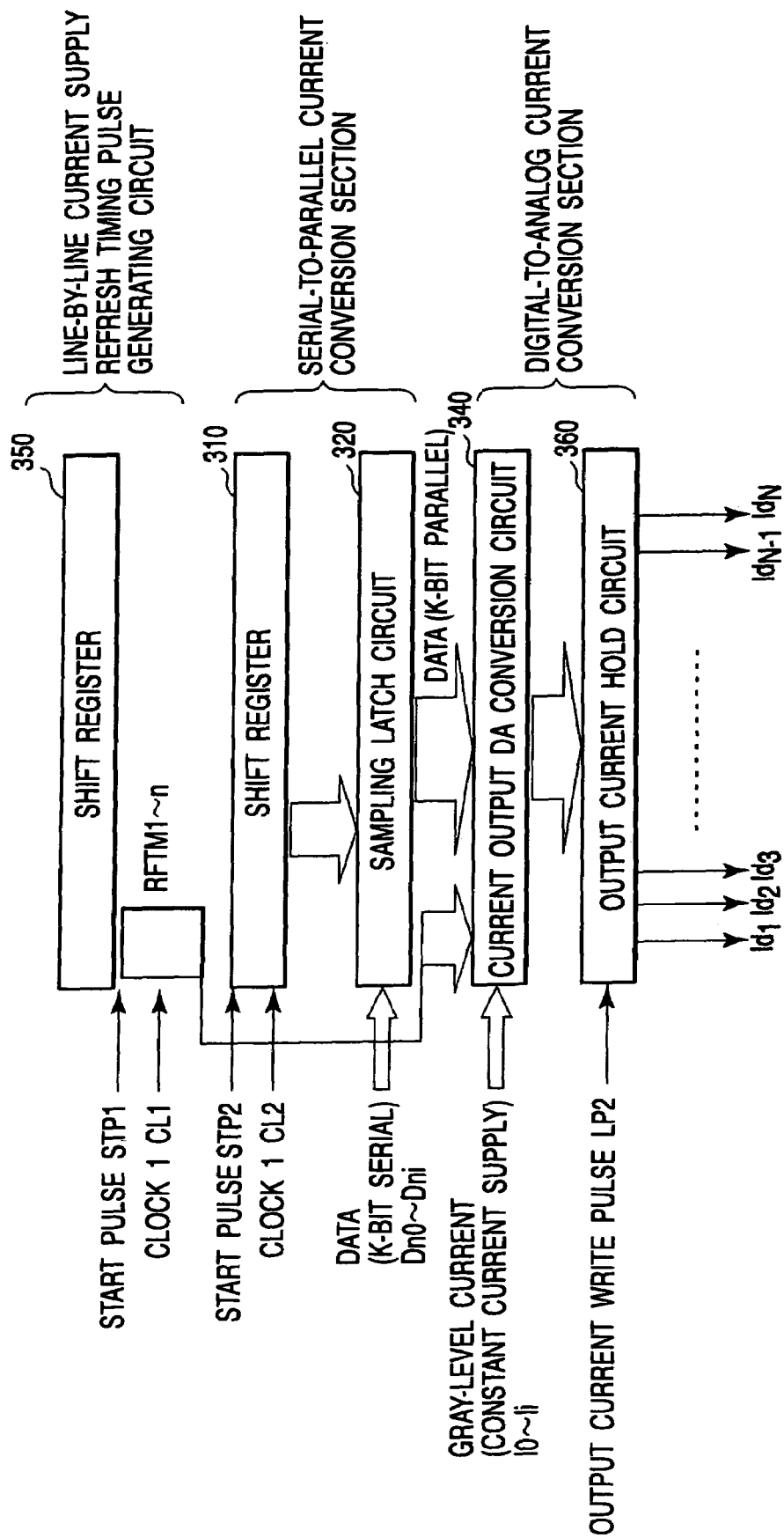
FIG. 13 is a block diagram that shows a video signal driver according to another modification of the present invention.
Figure 14:
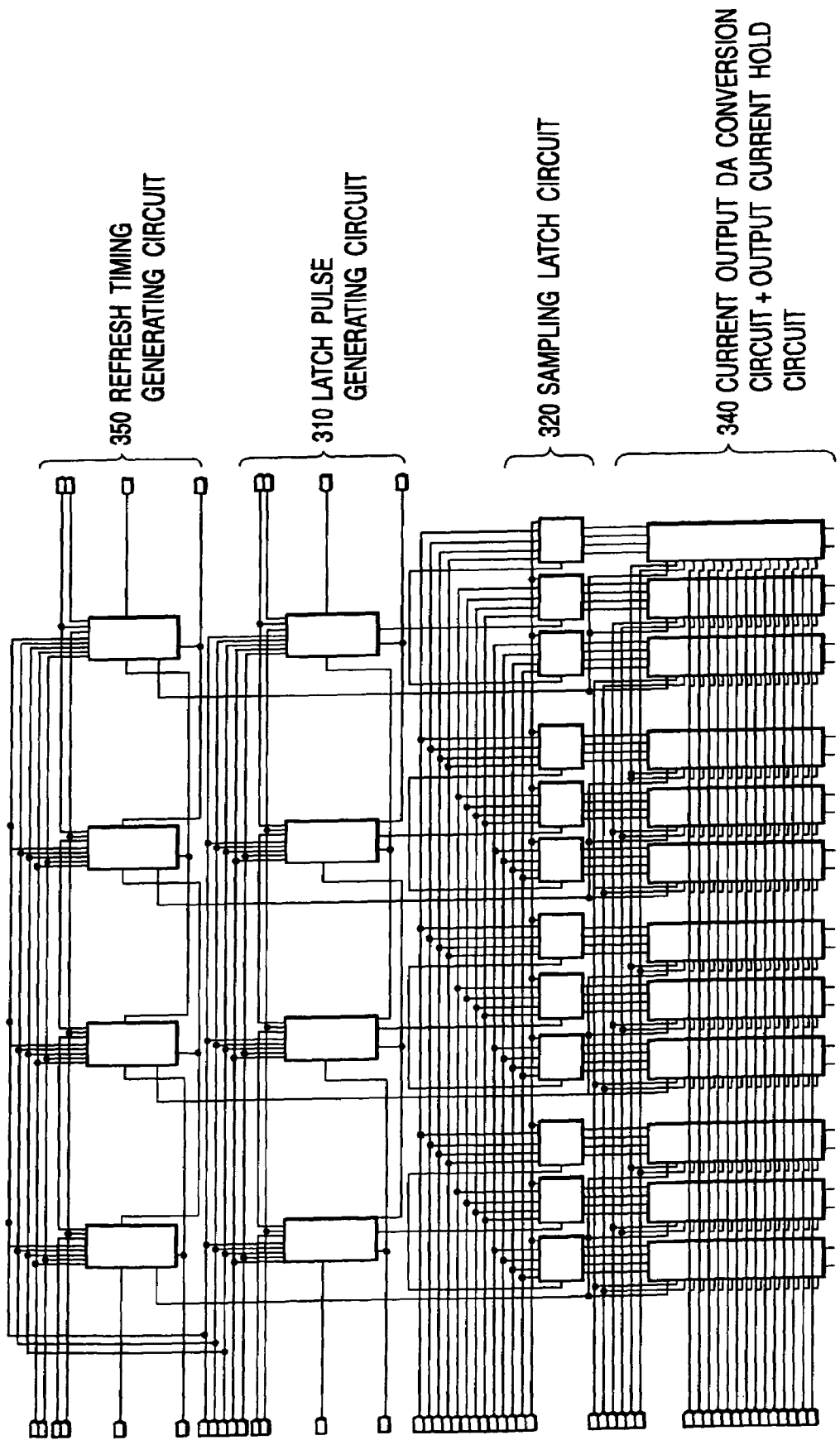
FIG. 14 is a circuit diagram that shows a part of the video signal driver according to the modification of the present invention.

As is shown in FIG. 13 and FIG. 14, the load latch circuit may be omitted, and the output of the sampling latch circuit 320 may be input to the DA conversion circuit 340. The circuit configuration of the refresh timing pulse generating circuit 350 is thus altered such that the refresh timing pulse RFTM and latch pulse SROUT may become active later. Thereby, the circuit scale can greatly be reduced, and the picture-frame region can be made narrower.

Next, a second embodiment of the present invention is described. The second embodiment has the same structure as the first embodiment except that the constant current memory circuit 342 in the DA conversion circuit 340 is configured as a differential current copy circuit. The parts common to those in the first embodiment are denoted by like reference numerals and a description thereof is omitted.

Figure 15:
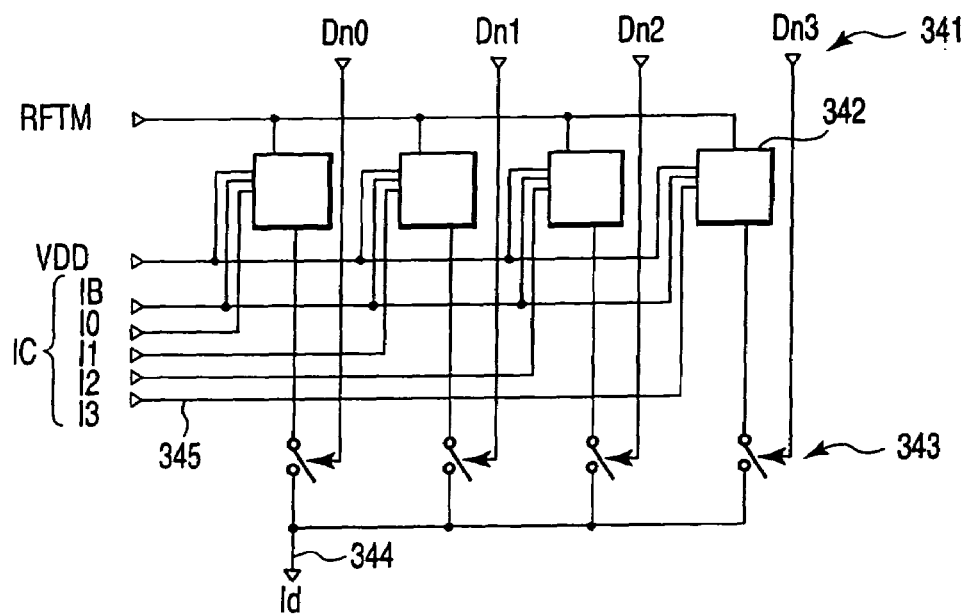
FIG. 15 shows a DA unit of an organic EL display device according to a second embodiment of the invention.
Figure 16:
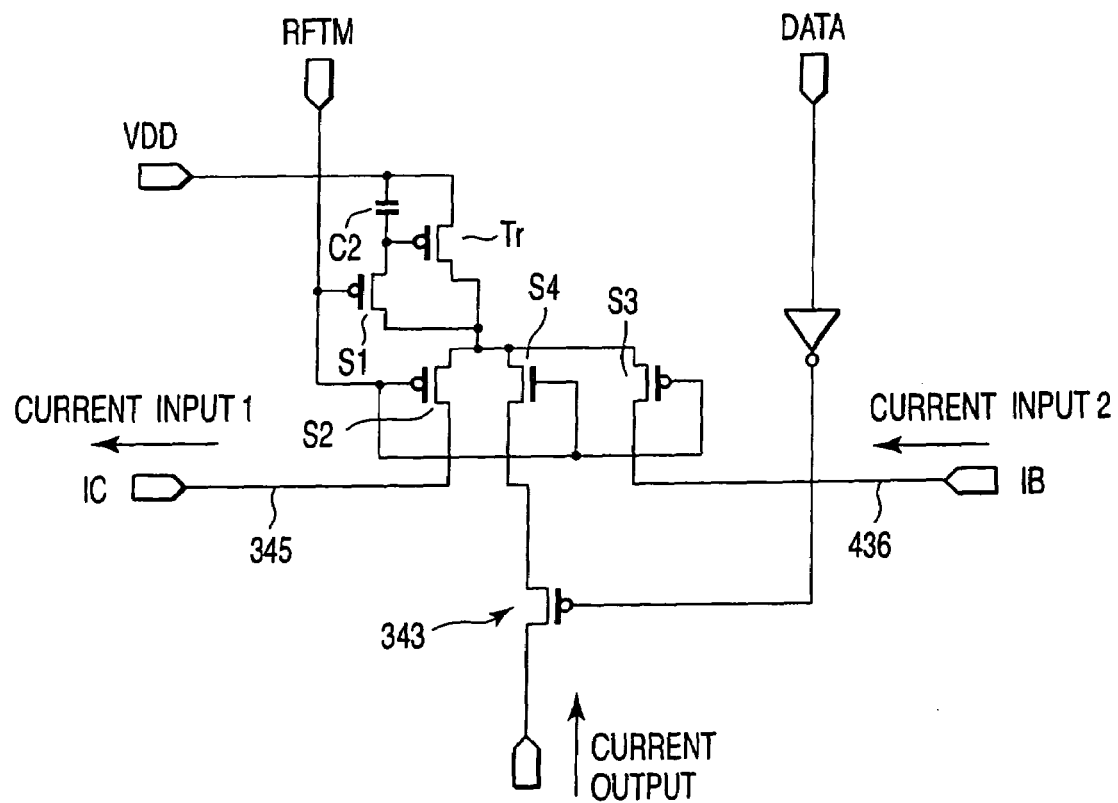
FIG. 16 is a circuit diagram that shows a part of the DA unit of the organic EL display device according to the second embodiment.

FIG. 15 shows an example of the circuit configuration of the DA unit 341, and FIG. 16 shows the structure of a 1-bit component of the DA unit 341. Each DA unit 341 operates with 4-bit data signals DATA (D0–D3). Each DA unit 341 comprises constant current memory circuits 342, the number of which corresponds to the number of bits of the data signals DATA; switch circuits 343 that control output/non-output of the associated constant current memory circuits 342 in accordance with the data signals DATA; a video current output line 344 that connects the respective output terminals of the switch circuits 343; a base current supply line 436 that supplies a common base current IB to the constant current memory circuits 342; and constant current supply lines 345 that supply different constant currents IC to the respective constant current memory circuits 342.

The constant current memory circuit 342 is a circuit that stores gray-level reference currents I0 to I3, which are input at a selection time, and outputs the stored gray-level reference currents I0 to I3 at a non-selection time. In this embodiment, the constant current memory circuit 342 is composed of a two-input current copy circuit. Specifically, the constant current memory circuit 342 comprises a transistor Tr; a switch S1 that is connected between the gate and drain of the transistor Tr; a switch S2 that is connected between the drain of the transistor Tr and the constant current supply line 345; a switch S3 that is connected between the drain of the transistor and the base current supply line 436; a switch S4 that is connected between the drain of the transistor Tr and an output terminal of the current copy circuit; and a capacitor C2 having both terminals connected to the gate and source of the transistor.

In the state in which the switches S1, S2 and S3 are closed and the switch S4 is opened, the constant current memory circuit 342 constitutes a self-bias circuit between the gate and drain of the transistor Tr. The constant current memory circuit 342 operates such that a current flowing through the source-drain path of the transistor Tr via the switch S1 may become a desired gray-level reference current Ii. The gray-level reference current Ii is set by executing such a control that the constant current that is set via the constant current supply line 345 becomes a sum current of the base current IB and the gray-level reference current Ii. In other words, the operation is executed such that the gray-level reference current Ii may become a difference current between the sum current and the gray-level base current IB. Subsequently, in the state in which the switches S1, S2 and S3 are opened and the switch S4 is closed, the capacitor stores a gate-source voltage at a time when the amount of the current, which flows through the source-drain path of the transistor Tr, becomes equal to that of the difference current. The gray-level reference current Ii is output via the switch S4. The switches S1 to S4 are controlled by a common control signal, i.e. the refresh timing pulse RFTM from the shift register 350 (or 370). The switch S1 to switch S3 are formed of thin-film transistors of the same polarity, and the switch S4 is formed of a thin-film transistor of a polarity that is different from the polarity of the switches S1 to S3. In this embodiment, the transistor Tr and switches S1 to S3 are p-type thin-film transistors, and the switch S4 is an n-type thin-film transistor.

For example, when the gray-level reference current Ii is 0.01 µA, the constant current (sum current) that is supplied from the constant current supply line may be set at 1.01 µA and the base current IB may be set at 1 µA. The current of 1 µA or more is flows to each input terminal. Thus, even if each current path has a capacitance of 10 pF, charging can be executed within 10 µs, and the transistor can be operated to cause a current of 0.01 µA to flow.

The output/non-output from the constant current memory circuit 342 is controlled by the switch circuit 343 in accordance with the data signals DATA. The sum of output currents from the switch circuits flows in the video current output line as a video current.

As described above, in the constant current memory circuit of the DA unit, write is executed by the difference current. In addition to the above-described advantageous effect, even where the capacitive load up to the input terminal is large, it is possible to improve a low-current write defect and to secure tone linearity in a low gray scale.

This write method using the difference current is applicable to the output current hold circuit. Specifically, the analog video current from the DA unit and the base current, which flows in a direction different from the direction of the analog video current, are input to the two-input current copy circuit. At the selection time, the difference current between the analog video current and the base current may be stored. At the non-selection time, the stored difference current may be output as the video current.

In the first and second embodiments, the description is given of the DA conversion circuit wherein selective output is effected by digital data after the plural gray-level reference currents are stored. Alternatively, the gray-level reference currents may first be selected, and the sum of the outputs of these currents may be input to the constant current memory circuit. Thus, the signal current value may be stored and retained. In this case, only one constant current memory circuit 342 may be provided for the video signal line 103, and the circuit scale can further be reduced.

The above-described organic EL display device can realize a display with a compact size and high display quality. Thus, the display device is applicable to a display for a mobile terminal. The above-described organic EL display device is also advantageously applicable to a display with a large waveform delay, such as a large-sized, high-definition display.

This invention is not limited directly to the embodiments described above, and its components may be embodied in modified forms without departing from the scope or spirit of the invention. Further, various inventions may be made by suitably combining a plurality of components described in connection with the foregoing embodiments. For example, some of the components according to the foregoing embodiments may be omitted. Furthermore, components according to different embodiments may be combined as required.

What is claimed is:

1. An active matrix display device comprising:
    a plurality of video signal lines formed on a substrate;
    a plurality of pixels which are connected to the video signal lines and are operated by current signals; and
    a video current supply section which converts a digital data signal, that is supplied from an external circuit, to a corresponding analog current signal, and outputs the analog current signal to the associated video signal line,
    the video current supply section including a plurality of DA units which are disposed in association with the respective video signal lines, and sums up at least one of a plurality of gray-level reference currents on the basis of the digital data signal, thereby executing conversion to the analog current signal; a refresh pulse generating circuit which successively outputs refresh timing pulses for controlling a timing for periodically storing the gray-level reference currents in said plurality of DA units; and output current hold circuits which are disposed in association with the respective video signal lines, successively store the analog current signals, and output the analog current signals as a batch to said plurality of video signal lines, and
    the output current hold circuit including a transistor which stores the analog current signal at a selection time and outputs the stored analog current signal at a non-selection time.

2. The active matrix display device according to claim 1, wherein the DA unit includes a plurality of constant current memory circuits which store and hold the gray-level reference currents, and switch circuits which select outputs of the constant current memory circuits in accordance with the data signals, and the DA unit outputs a signal current, which is a sum of selected constant currents, as the analog current signal.

3. The active matrix display device according to claim 1, wherein the DA unit includes switch circuits which select a plurality of said gray-level reference currents on the basis of the data signals, and constant current memory circuits which store and hold a signal current, that is a sum of selected constant currents, and the DA unit outputs the signal current as the analog current signal.

4. The active matrix display device according to claim 2, wherein the constant current memory circuit is a circuit which stores a constant current that is input at a selection time and outputs the stored constant current at a non-selection time, and the constant current memory circuit includes a transistor which is commonly used at the time of storing and at the time of output.

5. The active matrix display device according to claim 3, wherein the constant current memory circuit is a circuit which stores a constant current that is input at a selection time and outputs the stored constant current at a non-selection time, and the constant current memory circuit includes a transistor which is commonly used at the time of storing and at the time of output.

6. The active matrix display device according to claim 1, further comprising a scan driver which executes a selection/non-selection control of the pixels, the scan driver being integrally formed on the substrate.

7. The active matrix display device according to claim 1, wherein the transistor is formed of a thin-film transistor which includes a semiconductor layer formed of polysilicon.

8. An active matrix display device comprising:
a plurality of video signal lines formed on a substrate;
a plurality of pixels which are connected to said video signal lines and are operated by current signals; and
a DA unit which is formed on the substrate and sums up at least one of a plurality of gray-level reference currents on the basis of digital data signals that are supplied from an external circuit, thereby executing conversion to an analog current signal,
the DA unit including a transistor; a capacitor connected between a gate and a source of the transistor; a first switch connected between the gate and a drain of the transistor; a second switch which is connected to the drain of the transistor and supplies the gray-level reference current; a switch element which outputs the gray-level reference current on the basis of the data signal; and a third switch connected between the drain of the transistor and the switch element.

9. An active matrix display device comprising:
a plurality of video signal lines formed on a substrate;
a plurality of pixels which are connected to said video signal lines and are operated by current signals; and
a DA unit which is formed on the substrate and sums up at least one of a plurality of gray-level reference currents on the basis of digital data signals that are supplied from an external circuit, thereby executing conversion to an analog current signal,
the DA unit being configured to receive a gray-level current and a base current that flows in a direction different from a direction of the gray-level current, store a difference current between the gray-level current and the base current at a selection time, and output the stored difference current as the analog current signal at a non-selection time.

10. An active matrix display device comprising:
a plurality of video signal lines formed on a substrate;
a plurality of pixels which are connected to said video signal lines and are operated by current signals;
a DA unit which sums up at least one of a plurality of gray-level reference currents on the basis of digital data signals that are supplied from an external circuit, thereby executing conversion to an analog current signal; and
an output current hold circuit which successively stores the analog current signals and outputs the analog current signals as video current signals to said plurality of video signal lines,
the DA unit being configured to receive an analog current signal and a base current that flows in a direction different from a direction of the analog current signal, store a difference current between the analog current signal and the base current at a selection time, and output the stored difference current as the video current signal at a non-selection time.

11. A digital-to-analog converter which sums up at least one of a plurality of gray-level reference currents on the basis of digital data that is supplied from an external circuit, thereby executing conversion to an analog current signal, the digital-to-analog converter characterized by comprising a constant current memory circuit which receives a gray-level current and a base current that flows in a direction different from a direction of the gray-level current, stores a difference current between the gray-level current and the base current at a selection time, and outputs the stored difference current as the gray-level reference current or the analog current signal at a non-selection time.

* * * * *